United States Patent
Yonezawa et al.

(10) Patent No.: US 9,285,506 B2
(45) Date of Patent: Mar. 15, 2016

(54) ITO FILM, ITO POWDER USED IN MANUFACTURING SAME ITO FILM, MANUFACTURING METHOD OF ITO POWDER, AND MANUFACTURING METHOD OF ITO FILM

(71) Applicant: MITSUBISHI MATERIALS CORPORATION, Tokyo (JP)

(72) Inventors: Takehiro Yonezawa, Naka (JP); Kazuhiko Yamasaki, Naka (JP); Ai Takenoshita, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 38 days.

(21) Appl. No.: 13/913,794

(22) Filed: Jun. 10, 2013

(65) Prior Publication Data

US 2013/0330267 A1    Dec. 12, 2013

(30) Foreign Application Priority Data

Jun. 12, 2012 (JP) .................................. 2012-132483

(51) Int. Cl.
| | | |
|---|---|---|
| *C01G 1/00* | (2006.01) | |
| *G02B 1/00* | (2006.01) | |
| *C01G 1/02* | (2006.01) | |
| *G02B 5/20* | (2006.01) | |
| *H01L 31/18* | (2006.01) | |
| *C01G 19/00* | (2006.01) | |
| *B82Y 30/00* | (2011.01) | |

(52) U.S. Cl.
CPC . *G02B 1/00* (2013.01); *B82Y 30/00* (2013.01); *C01G 1/02* (2013.01); *C01G 19/00* (2013.01); *G02B 5/207* (2013.01); *H01L 31/1884* (2013.01); *C01P 2004/64* (2013.01); *C01P 2006/12* (2013.01); *C01P 2006/40* (2013.01); *C01P 2006/62* (2013.01); *C01P 2006/63* (2013.01); *C01P 2006/64* (2013.01); *Y02E 10/50* (2013.01)

(58) Field of Classification Search
None
See application file for complete search history.

(56) References Cited

U.S. PATENT DOCUMENTS

2007/0154629 A1* 7/2007 Fujita .................... 427/126.3
2007/0298222 A1* 12/2007 Hsu et al. .................. 428/156

FOREIGN PATENT DOCUMENTS

| CN | 1989081 A | 6/2007 |
|---|---|---|
| JP | 2005-054273 A | 3/2005 |
| JP | 2009-032699 A | 2/2009 |
| JP | 2011-116623 A | 6/2011 |

OTHER PUBLICATIONS

Office Action issued in corresponding Chinese Patent Application No. CN 201310231700.7, dated Jun. 10, 2015.
Search Report issued in corresponding Chinese Patent Application No. CN 201310231700.7, dated Jun. 10, 2015.

* cited by examiner

*Primary Examiner* — Steven Bos

(74) *Attorney, Agent, or Firm* — Locke Lord LLP; James E. Armstrong, IV; Nicholas J. DiCeglie, Jr.

(57) ABSTRACT

An ITO film having a band gap in a range of 4.0 eV to 4.5 eV.

2 Claims, No Drawings

ITO FILM, ITO POWDER USED IN MANUFACTURING SAME ITO FILM, MANUFACTURING METHOD OF ITO POWDER, AND MANUFACTURING METHOD OF ITO FILM

BACKGROUND OF THE INVENTION

1. Field of the Invention

The present invention relates to an ITO film having high optical transmittance in a visible light region, ITO powder used in manufacture of the same ITO film, a manufacturing method of the ITO powder, and a manufacturing method of an ITO film. In the present specification, ITO refers to Indium Tin Oxide.

Priority is claimed on Japanese Patent Application No. 2012-132483, filed on Jun. 12, 2012, the content of which is incorporated herein by reference.

2. Description of Related Art

An indium tin oxide film (hereafter referred to as ITO film) used in the conventional art has a band gap of about 3.75 eV and high transparency in the wavelength range of visible light (for example, see Paragraph [0009] of Japanese Unexamined Patent Application, First Publication No. 2009-032699). Therefore, the ITO film has been widely used in a field requiring excellent optical characteristics such as application as a transparent electrode of a liquid crystal display (for example, see Paragraph [0006] of Japanese Unexamined Patent Application, First Publication No. 2005-054273) or a heat shielding material having high heat shielding performance (for example, see Paragraph [0002] of Japanese Unexamined Patent Application, First Publication No. 2011-116623).

Although the conventional ITO film has high transparency in the wavelength range of visible light, absorption edge of the ITO film spread to the visible light region resulting in weak optical absorption near the absorption edge. Due to this phenomenon, the transmittance for the entire wavelength range in the visible light region is decreased, and the ITO film manufactured by a sputtering method tends to show yellowish appearance. The yellowish color is regarded as defective characteristic that deteriorates the appearance of the optical film submitted to visual observation.

On the other hand, the ITO film is also used as a heat cutting film which has recently attracted attention as energy-saving measures in the summer time. In this case, the ITO film is required to shield near infrared rays and have high visible light transmittance.

An object of the present invention is to provide an ITO film having an improved property as an optical film by increasing optical transmittance in the visible light region. Another object of the present invention is to provide ITO powder (indium tin oxide powder) used in manufacturing of the same ITO film. Further, the present invention aims to provide a manufacturing method of such an ITO powder and a manufacturing method of an ITO film.

SUMMARY OF THE INVENTION

A first aspect of the present invention is an ITO film (indium tin oxide film) that has a band gap (optical band gap) in a range of 4.0 eV to 4.5 eV.

A second aspect of the present invention is an ITO powder (indium tin oxide powder) used in manufacturing the ITO film according to the first aspect.

The above-described ITO powder has perse color tone (in $L^*a^*b^*$ color system, $L^*$=equal to or less than 30 wherein $a^*<0$ and $b^*<0$).

The above-described ITO powder has heat shielding effects such that a dispersion solution (liquid-state dispersion) having concentration of the ITO powder in a range of 0.7% by mass and 1.2% by mass shows solar transmittance of equal to or less than 60%, visible light transmittance of equal to or more than 85%, and haze of equal to or less than 0.5%, in measurement of a cell having optical length of 1 mm.

A third aspect of the present invention is a manufacturing method of ITO powder including: forming a co-precipitated hydroxide of indium and tin by mixing an aqueous solution dissolving a trivalent indium compound and divalent tin compound and an alkaline aqueous solution, and thereby obtaining the co-precipitated hydroxide of indium and tin by a reaction under conditions of pH of 4.0 to 9.3 and a temperature of 10 to 80° C.; forming a slurry containing indium tin hydroxide by performing one or plural times of water washing by adding pure water to the co-precipitated hydroxide and subsequently removing supernatant liquid, and obtaining the slurry containing the indium tin hydroxide by removing (finally removing) the supernatant liquid at a stage where resistivity of the supernatant liquid is equal to or more than 5000 Ω·cm; and performing formation of a surface-reformed ITO powder using the slurry as a raw material.

According to the method of the above-described third aspect, it is possible to manufacture the ITO powder according to the second aspect.

A fourth aspect of the present invention is the manufacturing method of ITO powder according to the third aspect, wherein the formation of the surface-reformed ITO powder includes: irradiating ultraviolet light to the slurry; forming aggregates of ITO by drying and firing the slurry, forming an ITO powder by pulverizing and loosening the aggregates of ITO; and forming a surface-reformed ITO powder by impregnating the ITO powder with mixed liquid of dehydrated ethanol and distilled water, and subsequently heating the ITO powder impregnated with the mixed liquid.

A fifth aspect of the present invention is the manufacturing method of ITO powder according to the third aspect, wherein the formation of the surface-reformed ITO powder includes converting the slurry to aerosol using ultrasound, and spraying the aerosol to an heated inert gas.

A sixth aspect of the present invention is the manufacturing method of ITO powder according to the third aspect, wherein the formation of the surface-reformed ITO powder includes forming a dispersion solution by dispersing indium tin hydroxide powder obtained by drying the slurry in a solution, and irradiating a laser light to the dispersion solution.

A seventh aspect of the present invention is the manufacturing method of ITO powder according to the third aspect, wherein the formation of the surface reformed ITO powder includes: forming aggregates of ITO by drying and firing the slurry; forming an ITO powder by pulverizing and loosening the aggregates of ITO, forming an ITO nanopowder having an average particle size of 5 nm to 15 nm by further pulverizing the ITO powder using a jet mill, impregnating the ITO nanopowder with mixed liquid of dehydrated ethanol and distilled water, and heating the ITO nanopowder impregnated with the mixed liquid.

An eighth aspect of the present invention is a manufacturing method of an ITO film including manufacturing an ITO powder by the manufacturing method of ITO powder according to any one of the above-described third aspect to seventh aspect.

According to the manufacturing method of an ITO film of the above-described eighth aspect, it is possible to manufacture an ITO film according to the above-described first aspect.

In the ITO film of the present invention, band gap of the ITO film is shifted from the conventional value of 3.75 eV to a higher energy side. As a result, yellowish color regarded as a defective appearance as an optical film is avoided. In addition, it is possible to improve properties as the optical film, particularly properties as the heat cutting film, by increasing transmittance in the visible light region.

DETAILED DESCRIPTION OF THE INVENTION

Next, the preferred embodiments for carrying out the present invention will be explained.

An ITO film of the present invention is an ITO film that has a band gap in a range of 4.0 eV to 4.5 eV, preferably in a range of 4.0 eV to 4.35 eV.

Where the band gap is smaller than 4.0 eV, transmittance of light in the visible light region is not improved sufficiently. The upper limit value of the band gap, 4.5 eV is a maximum value that can be achieved with the current technology.

The band gap of an ITO film can be determined based on a graph that shows a relationship between $\alpha^2$ and photon energy, where $\alpha$ denotes an absorption coefficient. That is, where the relationship between $\alpha^2$ and photon energy is shown as a curve in a graph by plotting the photon energy along horizontal axis of the graph and plotting $\alpha^2$ along vertical axis of the graph, the optical band gap is calculated from the photon energy shown by intersection of the horizontal axis and a line extrapolated from collinear approximated portion of the curve.

ITO powder used in manufacture of the above-described ITO film has deep blue color tone (in L*a*b* color system, L*=equal to or less than 30 wherein a*<0 and b*<0). The above-described ITO powder has heat shielding effects such that a dispersion solution having concentration of the ITO powder in a range of 0.7% by mass and 1.2% by mass shows solar transmittance of equal to or less than 60%, visible light transmittance of equal to or more than 85%, and haze of equal to or less than 0.5%, in measurement of a cell having optical length of 1 mm.

Preferably, the above-described ITO powder has a BET specific surface area of 20 to 100 m$^2$/g. Preferably, crystal particle size of the ITO powder determined by X-ray diffraction (XRD) is 5 to 30 nm.

A manufacturing method of ITO powder used in manufacture of the above-described ITO powder includes: forming a co-precipitated hydroxide of indium and tin by mixing an aqueous solution dissolving a trivalent indium compound and divalent tin compound and an alkaline aqueous solution, and thereby obtaining the co-precipitated hydroxide of indium and tin by a reaction under conditions of pH of 4.0 to 9.3 and a temperature of 5° C. or higher, preferably 10 to 80° C.; forming a slurry containing indium tin hydroxide by performing one or plural times of water washing by adding pure water to the co-precipitated hydroxide and subsequently removing supernatant liquid, and obtaining the slurry containing the indium tin hydroxide by finally removing the supernatant liquid at a stage where resistivity of the supernatant liquid is equal to or more than 5000 Ω·cm; and performing formation of a surface-reformed ITO powder (surface-reformation) using the slurry as a raw material.

For example, a mixed aqueous solution of indium trichloride ($InCl_3$) and tin dichloride ($SnCl_2 \cdot 2H_2O$), and an alkaline aqueous solution composed of ammonia ($NH_3$) water or ammonium hydrogen carbonate ($NH_4HCO_3$) water may be used in the formation of the co-precipitated hydroxide. It is possible to obtain co-precipitated hydroxide of indium and tin having high crystallinity by controlling the pH value and the temperature to the above-described conditions.

The above-described formation of the surface-reformed ITO powder (surface reforming step) may be performed by one of the following four types of methods (four optional methods). In the present invention, by performing the surface reforming treatment of the ITO powder, it is possible to increase the visible light transmittance of the ITO film manufactured using this ITO powder.

In a first formation method of surface reformed ITO powder, an ultraviolet light having a wavelength of 126 nm to 365 nm is irradiated to the above-described slurry for 1 to 50 hours while stirring the slurry. After that, aggregates of ITO are obtained by drying and firing the slurry. After that, the ITO aggregates are pulverized and loosened (disintegrated) to obtain ITO powder, and the ITO powder is impregnated with a surface treatment solution composed of a mixed solution of dehydrated ethanol and water. Subsequently, the ITO powder impregnated with the surface treatment solution is heated to form a surface-reformed ITO powder.

The slurry may be dried by heating at a temperature in a range of 100 to 200° C. for 2 hours to 24 hours in the air atmosphere or in an inert gas atmosphere. The dried slurry may be fired at a temperature of 250 to 800° C. for 0.5 hours to 6 hours. The surface treatment solution impregnated in the ITO powder obtained by pulverizing the ITO aggregates may be constituted of a mixed solution containing dehydrated ethanol of 50 parts by mass to 95 parts by mass and distilled water of 5 parts by mass to 50 parts by mass. The ITO powder impregnated with the surface treatment solution may be heated at a temperature of 200 to 400° C. for 0.5 to 5 hours, under an inert gas (for example, nitrogen gas) atmosphere.

In a second method of formation of the surface reformed ITO powder, inert gas (for example, nitrogen gas) as a carrier gas is introduced into a tubular furnace maintained at a temperature of 200 to 800° C. The above-described slurry is converted to aerosol using ultrasound of 40 kHz to 2 MHz, and is sprayed to the carrier gas flowing in the tubular furnace. By this process, it is possible to obtain surface-reformed ITO powder by pyrolysis of the indium tin hydroxide.

In a third formation method of the surface-reformed ITO powder, the slurry is dried to obtain indium tin hydroxide powder. A dispersion solution is formed by dispersing this indium tin hydroxide powder in a solution. The particles of the indium tin hydroxide are subjected to refining and pyrolysis by irradiation of laser light to the dispersion solution. As a result, ITO powder is manufactured.

The slurry may dried under the conditions of a temperature in a range of 100 to 200° C. and a time of 2 to 24 hours, for example, in the atmosphere or in an inert gas (for example, nitrogen or argon) atmosphere. The laser light is preferably pulse laser light having intensity of equal to or more than 10 mJ per one pulse (10 mJ/pulse), preferably 50 mJ/pulse to 500 mJ/pulse, and preferably having a pulse width of 1 ns to 20 ns. A peak value (peak power) of the laser light is preferably 0.5 MW to 500 MW. An oscillation frequency (pulse period) of the laser is preferably 10 to 60 Hz, and average power thereof is preferably 0.1 to 30 W.

For example, the solution (dispersion medium) for forming the dispersion solution may be selected from the group consisting of deionized water, ethanol, methanol, butanol, isopropyl alcohol, and propyl alcohol. A surfactant such as a zwitterionic (amphoteric) surfactant, a cationic surfactant, or a non-ionic surfactant, or a substance such as metallic salt, acid, or alkali may be added to the solution as an additive. The concentration of the ITO powder dispersed in the solution is preferably equal to or less than 10 g/L, more preferably equal to or less than 0.02 g/L, and particularly preferably equal to or more than 0.005 g/L and equal to or less than 0.01 g/L.

In a fourth formation method of the surface-reformed ITO powder, the slurry is dried and fired to form aggregates of ITO, and ITO powder formed by pulverizing and loosening (disintegrating) the aggregates of ITO is further pulverized by a jet mill to obtain ITO nanopowder having an average particle size of 5 to 15 nm. After impregnating the ITO nanopowder with a mixed solution (surface treatment solution) of dehydrated ethanol and distilled water, the ITO powder is subjected to heat treatment under a nitrogen atmosphere, and thereby obtaining a surface-reformed ITO powder.

The slurry may be dried by being heated at a temperature of 100 to 200° C. for 2 to 24 hours in the air atmosphere or in an inert gas atmosphere. The dried slurry may be fired by heating at a temperature of 250 to 800° C. for 0.5 hours to 6 hours in the air atmosphere.

The surface treatment solution to be impregnated in the powder obtained by pulverizing the ITO aggregates may be a mixed solution of dehydrated ethanol of 50 to 95 parts by mass and distilled water of 5 to 50 parts by mass. The solution-impregnated ITO nanopowder may be heated at a temperature of 200 to 400° C. for 0.5 hours to 5 hours under an inert gas (for example, nitrogen gas) atmosphere.

The ITO film of the present invention can be manufactured by using the ITO powder obtained by the above-described manufacturing method of ITO powder. A general film forming method may be used as a formation process of an ITO film using the ITO powder. For example, the ITO powder may be dispersed in a dispersion medium containing water and/or an organic solvent to obtain a dispersion solution, and the dispersion solution may be applied to a base material.

Hereafter, embodiments of the manufacturing method of ITO powder used in manufacture of the ITO film of the present invention will be further described.

(1) First Manufacturing Method

First Embodiment

Slurry Manufacturing Method

A trivalent indium compound and a divalent tin compound are precipitated in a solution under the presence of alkali, and generate co-precipitated hydroxide of indium and tin. At that time, it is possible to perform precipitation of co-precipitated hydroxide of indium and tin characterized by bright yellow to yellowish-brown color tone of dried powder by controlling pH of the solution to be 4.0 to 9.3, preferably to be 6.0 to 8.0, while controlling a temperature of the solution to be equal to or higher than 5° C., preferably 10 to 80° C. The co-precipitated hydroxide having the bright yellow to yellowish-brown color tone is excellent in crystallinity than the conventional indium tin hydroxide having white color. For example, in order to control pH during the reaction to be 4.0 to 9.3, it is preferable to use a mixed aqueous solution of indium trichloride ($InCl_3$) and tin dichloride ($SnCl_2.2H_2O$), and to drop the mixed aqueous solution and alkaline aqueous solution simultaneously in the water, and thereby controlling the pH value. Alternatively, the mixed solution may be dropped in the alkaline aqueous solution. As the alkaline aqueous solution, ammonia ($NH_3$) water or ammonium hydrogen carbonate ($NH_4HCO_3$) water or the like may be used.

After generating the co-precipitated indium tin hydroxide, the precipitate is washed by pure water. The washing is performed until that the resistivity of the supernatant liquid reaches a value of equal to or more than 5000 Ω·cm, preferably equal to or more than 50000 Ω·cm.

Where the resistivity of supernatant liquid is less than 5000 Ω·cm, impurities such as chlorine is not sufficiently removed. In this state, it is not possible to obtain indium tin oxide powder of high purity. When the supernatant liquid above the precipitate has the resistivity of equal to or more than 5000 Ω·cm, the supernatant liquid is removed to obtain a slurry having a slurry of high viscosity.

Surface Reforming Step

While stirring (agitating) the slurry containing the indium tin hydroxide, the slurry is irradiated with an ultraviolet light having a wavelength in a range of 126 nm to 365 nm for 1 hour to 50 hours. If the wavelength of the ultraviolet light is less than the lower limit, a general ultraviolet irradiation device cannot be used. If the wavelength of the ultraviolet light exceeds the upper limit, the precipitate scarcely absorbs the ultraviolet light, and therefore, an effect of irradiation of the ultraviolet light cannot be obtained. Where the irradiation time is shorter than the lower limit, it is impossible to achieve the effect of ultraviolet light irradiation due to insufficient absorption of the ultraviolet light by the precipitate. Where the ultraviolet light is irradiated for a time exceeding the above-described upper limit, particular effect cannot be obtained. After the irradiation of the ultraviolet light, the indium tin hydroxide in a slurry state (slurry containing indium tin hydroxide) is dried at a temperature of 100 to 200° C. for 2 hours to 24 hours in the air atmosphere, preferably under an inert gas atmosphere such as nitrogen or argon. Subsequently, the dried slurry is fired at a temperature of 250 to 800° C. for 0.5 to 6 hours in the air atmosphere. The aggregates formed by the firing are pulverized and loosened using a hammer mill, a ball mill or the like to obtain an ITO powder. This ITO powder is dipped in a surface treatment solution constituted of a mixture of dehydrated ethanol of 50 to 95 parts by mass and distilled water of 5 to 50 parts by mass, thereby impregnating the powder with the surface treatment solution. Surface-reformed ITO powder is obtained by placing the solution-impregnated ITO powder in a glass petri dish and heating the powder at a temperature of 200 to 400° C. for 0.5 hours to 5 hours in the nitrogen gas atmosphere.

(2) Second Manufacturing Method

Second Embodiment

Indium tin hydroxide of slurry state is obtained by removing the supernatant liquid from the co-precipitated hydroxide of indium and tin obtained in the same manner as the first manufacturing method. On the other hand, a tubular furnace is disposed so that a longitudinal direction of the tube is aligned in vertical direction. While controlling the heating temperature of the tubular furnace to be in a range of 250 to 800° C., $N_2$ gas (nitrogen gas) as a carrier gas is introduced to flow inside the tubular furnace. In this state, the indium tin hydroxide in the slurry state is aerosolized by ultrasound of 40 kHz to 2 MHz, and the aerosol is sprayed to the $N_2$ gas flowing inside the furnace. As a result, the indium tin hydroxide is thermally decomposed (cracked) inside the tube furnace, and a surface-reformed ITO powder is recovered from the exhaust port of the tubular furnace.

In the method described above, where the frequency of the ultrasound is less than the lower limit, there is a defective coarsening of ITO powder due to large size of sprayed droplets including the indium tin hydroxide, that is, due to large amount of indium tin hydroxide in each droplet resulting in sintering of ITO during the thermal decomposition.

On the other hand, where the frequency of the ultrasound exceeds the upper limit, aerosol cannot be formed efficiently.

(3) Third Manufacturing Method

Third Embodiment

Indium tin hydroxide of slurry state is obtained by removing the supernatant liquid from the co-precipitated hydroxide of indium and tin obtained in the same manner as the first manufacturing method. After that, the indium tin hydroxide is dried at a temperature of 100° C. to 200° C. for 2 hours to 24 hours in the air atmosphere, or preferably in an atmosphere of inert gas such as nitrogen or argon, thereby obtaining indium tin hydroxide powder. Next, the indium tin hydroxide powder is dispersed in a solution to form a dispersion solution, and laser light is irradiated to the dispersion solution. Various lasers that can generate high power pulse light may be used in this method. For example, it is possible to use the Nd:YAG laser, excimer laser, and Ti sapphire laser, where Nd:YAG laser is preferable. Irradiation intensity of the laser light is acceptable where the intensity is sufficient for abrasion of the indium tin hydroxide irradiated with the laser light. For example, equal to or more than 10 mJ (10 mJ/pulse) is sufficient for intensity per one pulse. Preferably, the intensity per one pulse is 50 mJ/pulse to 500 mJ/pulse. Although the pulse width of the laser light is not limited, the pulse width of 1 ns to 20 ns is preferred. The peak value (peak power) is preferably 0.5 to 500 MW. Although the oscillation frequency (pulse period) of the laser is not limited, 10 Hz to 60 Hz is preferred. Preferably, the average power of the laser light is, 0.1 to 30 W.

In this method, the solvent (dispersion medium) used in the dispersion solution is not particularly limited. For example, water or an organic solvent such as alcohol or hexane may be used as a solvent of the dispersion solution. It is preferable to select a liquid that does not show strong optical absorption for the wavelength of laser light used in the irradiation. For example, in a case of using Nd:YAG laser having a wavelength of 266 nm to 1064 nm, it is preferable to use a liquid selected from deionized water, ethanol, methanol, butanol, isopropyl alcohol, and propyl alcohol. Various surfactants or a substance such as metallic salt, acid, or alkali may be added to the solution as an additive. The material of the additive is not particularly limited as long as the material is completely dissolved in the solution. Like as solution, it is particularly preferable to use an additive composed of a material that does not exhibit strong light absorption property for the wavelength of the irradiated laser light. For example, when Nd:YAG laser light having a wavelength of 266 to 1064 nm is used, it is preferable to use an additive such as a zwitterionic surfactant, a cationic surfactant, a non-ionic surfactant, or the like.

The wavelength of the laser light is not particularly limited where the deionized water is used as the solvent of the dispersion solution. Preferably, the light having a wavelength of 266 to 1064 nm may be used. Where an organic solvent and/or a surfactant is used, it is preferable to use a light having wavelength that is not strongly absorbed by the organic solvent and/or the surfactant. It is preferable to use light having a wavelength of 355 to 1064 nm. For example, a fundamental wave (wavelength: 1064 nm), a second harmonic wave (wavelength: 532 nm), a third harmonic wave (wavelength: 355 nm), a fourth harmonic wave (wavelength: 266 nm) or the like of Nd:YAG laser having a pulse width of nanoseconds may be used where the solution is selected from deionized water, or alcohol such as ethanol, methanol, butanol, isopropyl alcohol, and propyl alcohol.

The laser light is preferably irradiated through a condensing lens. On the other hand, it is possible to omit the use of the condenser lens where the laser light has sufficiently strong intensity. A focal length of the condensing lens used in the irradiation is preferably 50 cm to 3 cm, more preferably 10 cm to 5 cm. A light condensing point of the laser light may exist in the vicinity of the liquid surface, more preferably in the liquid. The concentration of the ITO powder dispersed in the solution is preferably equal to or less than 10 g/L, more preferably equal to or less than 0.02 g/L, and particularly preferably equal to or more than 0.005 g/L and equal to or less than 0.01 g/L.

By the laser abrasion, indium tin hydroxide is dissociated as atoms, ions, and clusters that are subsequently reacted to each other in the solution. As a result, average particle size becomes smaller than that of indium tin hydroxide before the laser irradiation, and pyrolysis occurs, and thereby forming ITO nanopowder. For example, abrasion occurred in the solution can be confirmed by detection of light emission from abrasion plasma.

A container that stores the dispersion solution (indium tin hydroxide powder dispersion solution and ITO powder dispersion solution) can be appropriately formed by selecting material and shape of generally-known containers or the like. During the laser irradiation, it is preferable to stir the dispersion solution (dispersion solution of indium tin hydroxide powder and ITO powder) using a stirring unit that is disposed on a bottom portion of the container. Well-known device can be used as the stirring unit. For example, a Teflon (trade mark) rotator that is provided via a magnetic stirrer may be used. The stirring rate is not particularly limited. It is preferable to use the stirring rate of 50 to 500 rpm. The indium tin hydroxide powder dispersion solution directly before the irradiation of the laser light preferably has a temperature of 20 to 35° C. The temperature of the solution during irradiation of the laser light is preferably 25 to 40° C.

After the irradiation of the laser light under the above-described conditions, the ITO nanopowder is observed by a transmission electron microscope. The average particle size of the powder in the ITO nanopowder dispersion solution after the laser irradiation is preferably equal to or more than 1 nm and equal to or less than 30 nm, more preferably equal to or more than 2 nm and equal to or less than 15 nm. The crystallinity of the ITO nanopowder after laser irradiation is evaluated by electron diffraction. In some case, amorphous ITO nanopowder is obtained depending on laser irradiation conditions. After the laser irradiation, the solution dispersing ITO nanopowder is subjected to solid-liquid separation. A surface-reformed ITO powder is obtained by drying the separated solid component.

(4) Fourth Manufacturing Method

Fourth Embodiment

Indium tin hydroxide of slurry state is obtained by removing the supernatant liquid from the co-precipitated hydroxide of indium and tin obtained in the same manner as the first manufacturing method. After that, the indium tin hydroxide is dried at a temperature of 100° C. to 200° C. for 2 hours to 24 hours in the air atmosphere, or preferably in an atmosphere of inert gas such as nitrogen or argon. After that, the dried indium tin hydroxide is fired at a temperature of 250 to 800° C. for 0.5 hours to 6 hours in the air atmosphere. The aggregates formed by this firing is pulverized and loosened using a hammer mill or a ball mill to obtain ITO powder (pulverizing and disintegrating step). This ITO powder is further subject to a pulverization process using a jet mill to control the average particle size of the powder to be in a range of 5 to 15 nm (a second pulverization step). After that, in the same manner as the first method, a surface-reformed ITO powder is obtained. The ITO powder (ITO nanopowder) is dipped in a surface treatment solution constituted of a mixture of dehydrated ethanol and distilled water, thereby impregnating the powder with the surface treatment solution. A surface-reformed ITO powder is obtained by placing the solution-impregnated ITO powder in a glass petri dish and heating the powder in the nitrogen gas atmosphere.

In the present description, the average particle size of the ITO powder refers to an average particle size based on number distribution. In the present invention, the average size of the 200 particles is used.

EXAMPLES

Next, Examples of the present invention and Comparative Examples will be described in detail.

Example 1

Manufacturing Method of Surface-Reformed ITO Powder

First, 50 mL of an indium trichloride ($InCl_3$) aqueous solution containing 18 g of In metal and 3.6 g of tin dichloride ($SnCl_2.2H_2O$) were mixed to form a mixed aqueous solution. This mixed aqueous solution and an ammonia ($NH_3$) aqueous solution were simultaneously dropped into 500 mL of water such that the pH was controlled to be 7. Then, the solution was subjected to reaction for 30 minutes while maintaining the temperature of the solution to be 30° C. The generated precipitate constituted of co-precipitated hydroxide of indium and tin was subject to decantation-cleaning by ion-exchange water repeatedly. When resistivity of supernatant liquid was equal to or more than 50000 Ω·cm, the supernatant liquid was finally removed (separated) from the precipitated to obtain a slurry state having high viscosity. While stirring this slurry, an ultraviolet light having a wavelength of 365 nm was irradiated to the slurry for 5 hours using an ultraviolet irradiation device (UL250 manufactured by HOYA-SCHOTT). After that, the indium tin hydroxide in a slurry state was dried at 110° C. overnight in the air atmosphere. Then the dried slurry was fired at 550° C. for 3 hours in the air atmosphere. About 25 g of ITO powder was obtained by pulverizing and loosening of aggregates obtained by the firing. The 25 g of the ITO powder was dipped in a surface treatment solution obtained by mixing dehydrated ethanol and distilled water, where 5 parts by mass of distilled water was mixed with 95 parts by mass of dehydrated ethanol. Thus the powder was impregnated with the surface treatment solution. The solution-impregnated powder was placed in a glass petri dish and was heated at 330° C. for 2 hours in a nitrogen gas atmosphere. Thus, a surface-reformed ITO powder was obtained.

Manufacturing Method of ITO Film 20 g of the surface-reformed ITO powder was added to a mixed solution of distilled water (0.020 g), triethylene glycol-di-2-ethylhexanoate [3G] (23.8 g), dehydrated ethanol (2.1 g), phosphoric acid polyester (1.0 g), 2-ethylhexanoate (2.0 g), and 2,4-pentanedione (0.5 g) and was dispersed in the mixed solution. The obtained dispersion solution was diluted by dehydrated ethanol until content of the ITO powder constituting the solid component was controlled to be 10% by mass. A film was formed by coating this diluted dispersion solution on a quartz glass plate by spin coating. Thus, an ITO film having a thickness of 0.2 μm was obtained.

Example 2

In the same manner as Example 1, co-precipitated hydroxide of indium and tin was obtained, and indium tin hydroxide in a slurry state was obtained by removing (separating) the supernatant liquid from the precipitate. After that, instead of irradiation of ultraviolet light used in Example 1, the slurry was aerosolized and sprayed to the hot carrier gas. A tubular furnace was disposed such that longitudinal direction of the tube was aligned in vertical direction. While controlling the heating temperature of the tubular furnace at 350° C. and introducing $N_2$ gas as the carrier gas in the tubular furnace, the indium tin hydroxide in a slurry state was aerosolized by ultrasound of 1.7 MHz and sprayed to the $N_2$ gas flowing inside the tubular furnace. As a result, thermal decomposition (pyrolysis) of the indium tin hydroxide occurred inside the tubular furnace, and surface-reformed ITO powder was recovered from an exhaust port of the tubular furnace. An ITO film was formed using this ITO powder in the same manner as Example 1.

Example 3

In the same manner as Example 1, co-precipitated hydroxide of indium and tin was obtained, and indium tin hydroxide in a slurry state was obtained by removing the supernatant liquid from the precipitate. After that, instead of irradiation of ultraviolet light used in Example 1, the indium tin hydroxide was dried at 110° C. overnight to obtain indium tin hydroxide powder. A dispersion solution dispersion indium tin hydroxide particles was prepared by dispersing the indium tin hydroxide powder in ethanol in concentration of 0.005 g/L. 40 mL of the dispersion solution controlled to have a temperature of 25° C. was taken from the dispersion solution and was installed in a glass cell (a vial bottle having an inner diameter of 30 mm, a body diameter of 35 mm, and a height of 80 mm). Pulse laser light was irradiated to the dispersion solution in the glass cell. A high power nanosecond Nd:YAG pulse laser (LAB-150-10 manufactured by Spectra-Physics KK.) was used as the laser device. Pulse laser light of 20 mJ/pulse, 50 mJ/pulse, 100 mJ/pulse, and 150 mJ/pulse of the third harmonic wave of the Nd:YAG pulse laser were respectively irradiated to the dispersion solution through a condenser lens constituted of synthetic silica plano-convex lens having a focal length of 50 mm. The distance between the condenser lens and the glass cell was controlled such that the condensing position of the laser light was positioned in the dispersion solution. On the other hand, only ethanol was installed in the same glass cell and was irradiated with the laser light. At that time, emission from plasma was detected due to braking down of ethanol by strong intensity of electric field in the condensing point, resulting in generation of the plasma. The laser light was irradiated to the dispersion solution for 60 minutes while stirring the dispersion solution by rotating a Teflon (trade mark) rotator (manufactured by TGK) at a rotation rate of 200 rpm using a magnetic stirrer (FS-05 manufactured by TGK). After that, the dispersion solution was subject to solid-liquid separation and the separated solid component was dried to obtain a surface-reformed ITO powder. An ITO film was formed using the ITO powder in the same manner as Example 1.

Example 4

In the same manner as Example 1, co-precipitated hydroxide of indium and tin was obtained, and indium tin hydroxide in a slurry state was obtained by removing the supernatant liquid from the precipitate. After that, instead of irradiation of ultraviolet light used in Example 1, the indium tin hydroxide was dried at 110° C. overnight to obtain indium tin hydroxide powder. The dried powder was fired at 550° C. for 3 hours in the air atmosphere to obtain ITO aggregates. ITO powder was obtained by pulverizing and loosening the ITO aggregates.

The ITO powder was further subject to pulverization using a jet mill (Starburst Mini manufactured by Sugino Machine Limited that was a jet mill applicable for extremely small amount of sample). 25 g of this ITO powder was dipped in a surface treatment solution obtained by mixing dehydrated ethanol and distilled water and was impregnated with the solution. After that the solution-impregnated powder was installed in a glass petri dish and was heated at 330° C. for 2 hours in a nitrogen gas atmosphere, to obtain surface-reformed ITO powder. An ITO film was formed using this ITO powder in the same manner as Example 1.

The ITO powders obtained by Examples 1 to 4 were subjected to measurement of BET specific surface area and crystal particle size. In any of the cases, the specific surface area was in the range of 20 to 100 m²/g, and the crystal particle size was in the range of 5 to 30 nm.

Specific surface area was measured by single point BET method using a specific surface area measurement device (Monosorb provided by Quantachrome Instruments). Crystal particle size was measured by using X-ray diffraction apparatus (D8 Advance provided by Bruker AXS). Each ITO powder was filled in the sample holder of the XRD apparatus, and X-ray was irradiated to the ITO powder from the angle in the range of 2θ/θ=15 to 90 degrees. The obtained diffraction chart was analyzed using TOPS, a Rietveld analysis software of Burker AXS, where the analysis was performed by Pawley method using FP as profile function, and crystal particle size was calculated from full width half maximum of Rolentz function component.

Comparative Example 1

In the same manner as Example 1, co-precipitated hydroxide of indium and tin was obtained. The precipitate was separated from the liquid by filtration. After that, the indium tin hydroxide was dried at 110° C. overnight to obtain indium tin hydroxide powder. The dried powder was fired at 550° C. for 3 hours in the air atmosphere to obtain ITO aggregates. ITO powder was obtained by pulverizing and loosening of the aggregates. The ITO powder was dipped in a surface treatment solution obtained by mixing dehydrated ethanol and distilled water, where 5 parts by mass of distilled water was mixed with 95 parts by mass of dehydrated ethanol. Thus the powder was impregnated with the surface treatment solution. The solution-impregnated powder was placed in a glass petri dish and was heated at 330° C. for 2 hours in a nitrogen gas atmosphere. Thus, a surface-reformed ITO powder was obtained.

An ITO film was formed by using this ITO powder in the same manner as Example 1.

Comparative Test
Measurement of Color Tone (Lab Value)

The color tones (L*, a*, and b*) of each ITO film obtained in Examples 1 to 4 and Comparative Example 1 are shown in Table 1. The L*a*b* values were measured using a color computer (SM-T) manufactured by Suga Test Instruments Co., Ltd.

Measurement of Spectral Characteristics

Visible light transmittance (% Tv) of respective ITO powder was measured using respective surface-reformed ITO powder obtained in Examples 1 to 4 and Comparative Example 1. Each 20 g of ITO powder obtained in Examples 1 to 4 and Comparative Example 1 was added and dispersed in a mixed solution of distilled water (0.020 g), triethylene glycol-di-2-ethylhexanoate [3G] (23.8 g), dehydrated ethanol (2.1 g), phosphoric acid polyester (1.0 g), 2-ethylhexanoate (2.0 g), and 2,4-pentanedione (0.5 g). Thus prepared dispersion solution was diluted by triethylene glycol-di-2-ethylhexanoate until content of the ITO powder became 0.7% by mass. This diluted dispersion solution was installed in a glass cell having a light path length of 1 mm. Visible light transmittance (% Tv) of the solution in a wavelength range of 380 nm to 780 nm was measured using an automatic recording spectrophotometer (U-4000 manufactured by Hitachi, Ltd.) based on the method standardized by JIS R 3216-1998. The visible light transmittance (% Tv) of Comparative Example 1 was set to 1, and degrees of changes of transmittance in Examples 1 to 4 were shown in Table 1.

Calculation of Band Gap

Band gap of each ITO film obtained in Examples 1 to 4 and Comparative Example 1 was calculated by the following method. The optical band gap was calculated from a transmission spectrum of the ITO film using a integrating sphere type spectrophotometer (U-4100 type manufactured by Hitachi High-Technologies Corporation). An absorption coefficient α was acquired from an equation shown below using transmittance T of the ITO film, and a relationship of $\alpha^2$ (vertical axis) and photon energy (E=1240/wavelength (nm)) (horizontal axis) was plotted in a graph. The portion of the curve which could be approximated by a linear line was extrapolated to the side of smaller absorption, optical band gap was calculated from the photon energy of the intersection of the extrapolated line and the horizontal axis. In the equation, d represents a film thickness of the ITO film. The band gap value of each ITO film obtained in Examples 1 to 4 and Comparative Example 1 is shown in Table 1.

$$T=\exp(\alpha d) \therefore \alpha^2 = [-\ln(T)/d]^2 \quad \text{(Equation 1)}$$

TABLE 1

| | Example 1 | Example 2 | Example 3 | Example 4 | Comparative Example 1 |
|---|---|---|---|---|---|
| L*a*b* of ITO film | L*: 99.5<br>a*: −0.21<br>b*: −0.06 | L*: 99.6<br>a*: −0.17<br>b*: −0.12 | L*: 99.7<br>a*: −0.35<br>b*: −0.16 | L*: 99.6<br>a*: −0.27<br>b*: −0.24 | L*: 99.3<br>a*: −0.33<br>b*: −0.11 |
| Degree of change of % Tv from Comparative Example 1 | 1.014 | 1.024 | 1.036 | 1.031 | 1 |
| Band gap (eV) | 4.08 | 4.15 | 4.35 | 4.21 | 3.90 |

Evaluation

As it is obvious from Table 1, regarding the color tones (Lab value), in any Examples, the b* value was a negative value, and the color tone was blue escaping from yellowish color. In addition, regarding the visible light transmittance (% Tv), where Tv was evaluated based on Comparative Example 1 as a standard, all the Examples showed higher value than Comparative Example 1 indicating improvement of the visible light transmittance. This was also confirmed from the fact that optical band gap in any one of Examples 1 to 4 was high so as to exceed 4.0 eV, compared to 3.90 eV of Comparative Example 1.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An ITO film having a band gap in a range of 4.0 eV to 4.5 eV, wherein the ITO film has an L*a*b* color tone in which L* is from 99.5 to 99.7, a* is from −0.35 to −0.17, and b* is from −0.24 to −0.06.

2. The ITO film according to claim 1, wherein the film is formed from an ITO powder having a perse color tone.

* * * * *